United States Patent
Leung et al.

(10) Patent No.: US 8,648,977 B2
(45) Date of Patent: Feb. 11, 2014

(54) METHODS AND APPARATUS FOR PROVIDING A FLOATING SEAL HAVING AN ISOLATED SEALING SURFACE FOR CHAMBER DOORS

(75) Inventors: Billy C. Leung, Fremont, CA (US); David E. Berkstresser, Los Gatos, CA (US); Shinichi Kurita, San Jose, CA (US)

(73) Assignee: Applied Materials, INC., Santa Clara, CA (US)

( * ) Notice: Subject to any disclaimer, the term of this patent is extended or adjusted under 35 U.S.C. 154(b) by 1923 days.

(21) Appl. No.: 11/194,503

(22) Filed: Aug. 1, 2005

(65) Prior Publication Data

US 2006/0028596 A1 Feb. 9, 2006

Related U.S. Application Data

(63) Continuation-in-part of application No. 11/145,018, filed on Jun. 2, 2005, now Pat. No. 8,206,075.

(60) Provisional application No. 60/598,039, filed on Aug. 2, 2004, provisional application No. 60/587,114, filed on Jul. 12, 2004, provisional application No. 60/576,906, filed on Jun. 2, 2004.

(51) Int. Cl.
*G02F 1/1333* (2006.01)

(52) U.S. Cl.
USPC ............................................ 349/58; 220/378

(58) Field of Classification Search
USPC ............. 220/378, 216; 349/58; 277/315, 312, 277/300, 628
See application file for complete search history.

(56) References Cited

U.S. PATENT DOCUMENTS

| | | | | |
|---|---|---|---|---|
| 2,288,263 A | * | 6/1942 | Bostwick | 277/644 |
| 3,869,132 A | * | 3/1975 | Taylor et al. | 277/608 |
| 4,854,600 A | * | 8/1989 | Halling et al. | 277/626 |
| 4,944,403 A | * | 7/1990 | LeKuch et al. | 206/594 |
| 5,226,632 A | | 7/1993 | Tepman et al. | |
| 6,089,543 A | | 7/2000 | Freerks | |

(Continued)

FOREIGN PATENT DOCUMENTS

| | | |
|---|---|---|
| EP | 1526565 A2 | 4/2005 |
| JP | 64-003371 | 1/1989 |

(Continued)

OTHER PUBLICATIONS

Office Action issued for Japanese Application No. P2005-163012 mailed Jul. 1, 2008.

(Continued)

*Primary Examiner* — Andrew Perreault
(74) *Attorney, Agent, or Firm* — Dugan & Dugan, PC

(57) ABSTRACT

A method is provided that includes isolating a sealing surface from a chamber wall of a chamber and sealing the chamber between the sealing surface and the chamber wall. An apparatus is provided that includes a chamber wall section prone to deflection, a stationary section providing a sealing surface, and a flexible bellows attached to the chamber wall section and the stationary section. A system is also provided that includes a chamber including a chamber wall having an opening, a door disposed to seal the opening, a sealing surface adjacent the opening and isolated from the chamber wall, and a seal between the sealing surface and the chamber wall. Numerous other aspects are provided.

10 Claims, 8 Drawing Sheets

(56) References Cited

U.S. PATENT DOCUMENTS

| | | |
|---|---|---|
| 6,338,626 B1 | 1/2002 | Saeki |
| 6,405,423 B1 | 6/2002 | Donde |
| 6,435,868 B2 | 8/2002 | White et al. |
| 6,932,354 B2 | 8/2005 | Kane et al. |
| 7,018,517 B2 | 3/2006 | Kurita et al. |
| 7,086,638 B2 | 8/2006 | Kurita et al. |
| 7,207,766 B2 | 4/2007 | Kurita et al. |
| 7,282,460 B2 | 10/2007 | Jang |
| 7,413,099 B2 * | 8/2008 | Takahashi et al. ............ 220/806 |
| 2003/0012624 A1 | 1/2003 | Kinnard et al. |
| 2004/0119240 A1 | 6/2004 | Hashimoto |
| 2005/0095088 A1 | 5/2005 | Kurita et al. |
| 2005/0285992 A1 | 12/2005 | White et al. |
| 2007/0204958 A1 | 9/2007 | Lee et al. |

FOREIGN PATENT DOCUMENTS

| | | |
|---|---|---|
| JP | 04-257244 | 9/1992 |
| JP | 08-258787 | 10/1996 |
| JP | 09-207668 | 8/1997 |
| JP | 2001140801 A | 5/2001 |
| JP | 2001-519971 | 10/2001 |
| JP | 2002-068364 | 3/2002 |
| JP | 2002-299272 | 10/2002 |
| JP | 2003-037108 | 2/2003 |
| JP | 2003-267916 | 9/2003 |
| KR | 1020000051650 | 8/2000 |
| KR | 1020010021748 | 3/2001 |
| KR | 1020010071717 | 7/2001 |
| KR | 1020030016188 A | 2/2003 |
| KR | 20040013294 | 2/2004 |
| KR | 100441875 B1 | 7/2004 |
| TW | 70375 | 9/1985 |
| TW | 0461013 B | 10/2001 |
| TW | 0463207 B | 11/2001 |
| TW | 0554390 B | 9/2003 |
| TW | 0554504 B | 9/2003 |
| WO | WO98/01891 | 1/1998 |
| WO | WO 02/05330 A2 | 1/2002 |
| WO | WO 03/023829 A2 | 3/2003 |
| WO | WO 03064885 A1 | 8/2003 |

OTHER PUBLICATIONS (App. No. 200510103894.8) OA dated Sep. 19, 2008.
(App. No. 2005-70755) OA dated May 21, 2008.
(App. No. 2005-70755) OA dated May 26, 2007.
(App. No. 094118263) SR dated Jun. 26, 2007.
(App. No. 094118263) OA dated Dec. 21, 2007.
Office Action of South Korea Application No. 10-2005-47239 dated Jul. 27, 2006.
U.S. Appl. No. 11/480,615, filed Jun. 2, 2005.
Office Action of Chinese Application No. 200510106737.2 dated Jun. 5, 2009.
Office Action of Japanese Application No. 2005-224297 dated Jun. 2, 2009.
Final Office Action of U.S. Appl. No. 11/145,018 mailed Nov. 2, 2009.
Jan. 17, 2012 Response to Final Office Action of U.S. Appl. No. 11/145,018 mailed Nov. 14, 20011.
Examiner Interview Summary of U.S. Appl. No. 11/145,018 mailed Jan. 25, 2012.
Advisory Action of U.S. Appl. No. 11/145,018 mailed Feb. 6, 2012.
Feb. 14, 2012 Response to Final Office Action of U.S. Appl. No. 11/145,018 mailed Nov. 14, 2011.
Notice of Allowance and Examiner Interview Summary of U.S. Appl. No. 11/145,018 mailed Feb. 29, 2012.
Office Action of Japanese Patent Application No. 2009-252239 dated Feb. 14, 2012.
Amendment After Final submitted with RCE of U.S. Appl. No. 11/145,018, filed Mar. 10, 2011.
Office Action of U.S. Appl. No. 11/145,018 mailed Apr. 29, 2008.
Jun. 16, 2008 response to Office Action of U.S. Appl. No. 11/145,018 mailed Apr. 29, 2008.
Office Action of U.S. Appl. No. 11/145,018 mailed Sep. 18, 2008.
Dec. 18, 2008 response to Office Action of U.S. Appl. No. 11/145,018 mailed Sep. 18, 2008.
Office Action of U.S. Appl. No. 11/145,018 mailed Apr. 30, 2009.
Jul. 23, 2009 response to Office Action of U.S. Appl. No. 11/145,018 mailed Apr. 30, 2009.
Feb. 2, 2010 Response to Final Office Action of U.S. Appl. No. 11/145,018 mailed Nov. 2, 2009.
Advisory Action of U.S. Appl. No. 11/145,018 mailed Feb. 25, 2010.
Office Action of U.S. Appl. No. 11/145,018 mailed May 3, 2010.
Office Action of U.S. Appl. No. 11/145,018 mailed Jun. 9, 2011.
Examiner Interview Summary of U.S. Appl. No. 11/145,018 mailed Jan. 12, 2010.
Examiner Interview Summary of U.S. Appl. No. 11/145,018 mailed Aug. 3, 2011.
Aug. 9, 2011 Response to Office Action of U.S. Appl. No. 11/145,018 mailed Jun. 9, 2011.
Interview Summary of U.S. Appl. No. 11/145,018, filed Aug. 9, 2011.
Oct. 4, 2010 Response to Office Action of U.S. Appl. No. 11/145,018 mailed May 3, 2010.
Final Office Action of U.S. Appl. No. 11/145,018 mailed Nov. 14, 2011.
Final Office Action of U.S. Appl. No. 11/145,018 mailed Dec. 10, 2010.
Taiwan Search Report of Taiwan Application No. 94126261 dated Feb. 27, 2007.

* cited by examiner

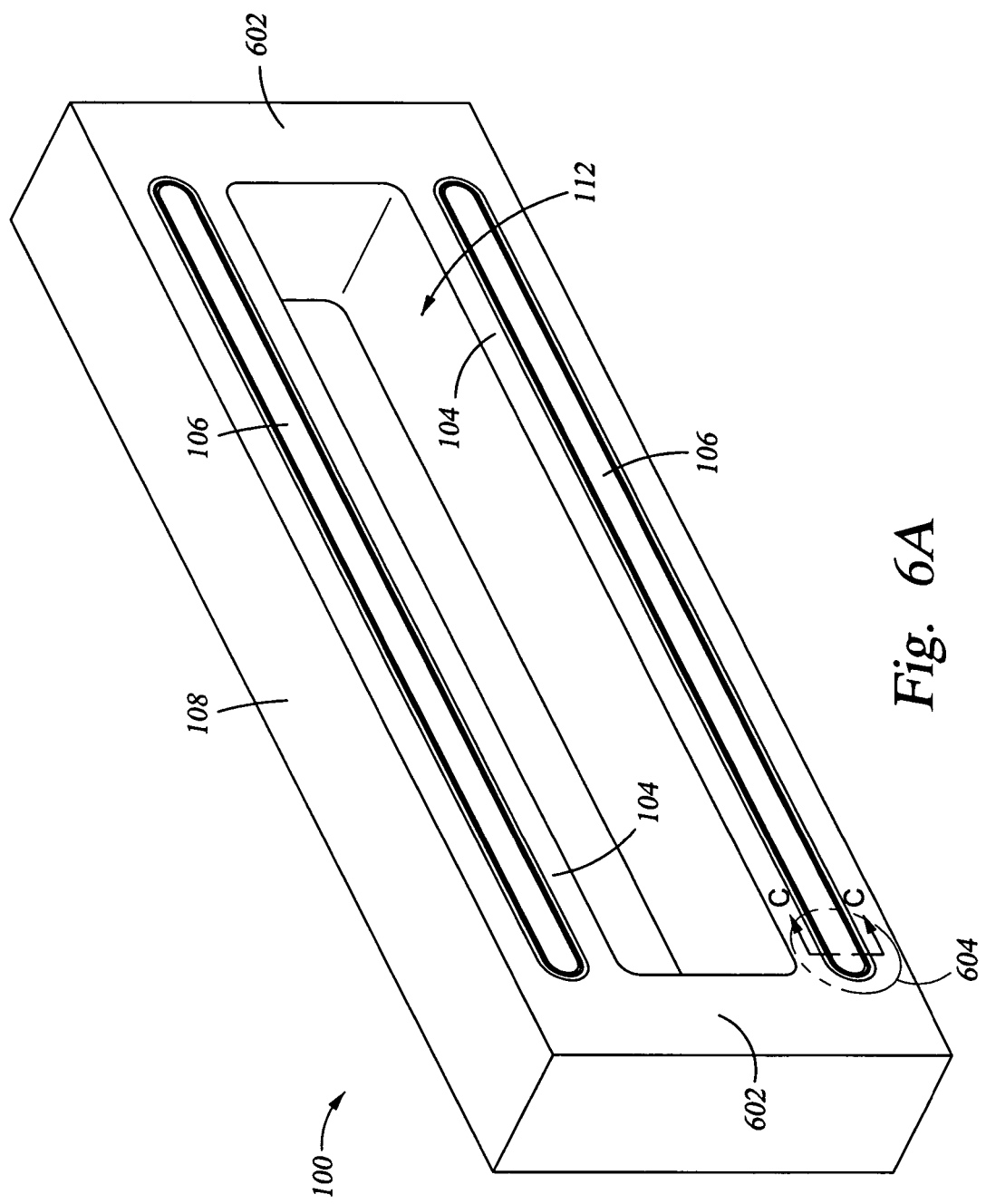

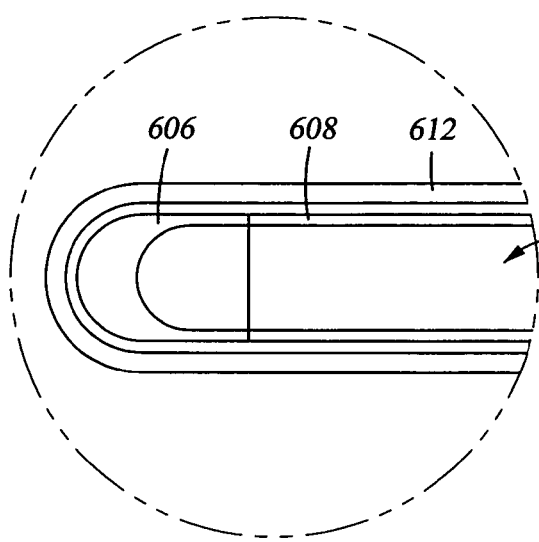
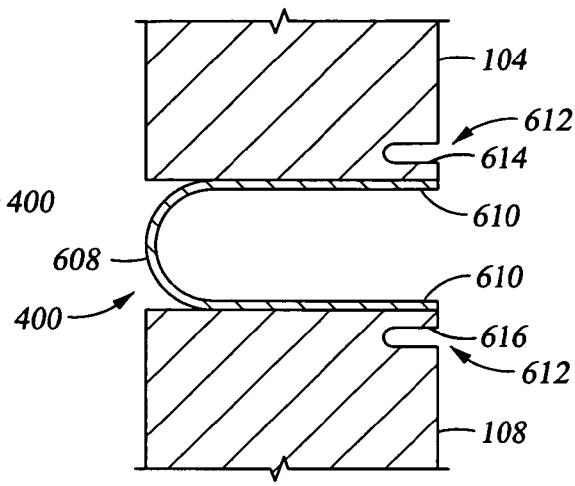
Fig. 6B
Fig. 6C
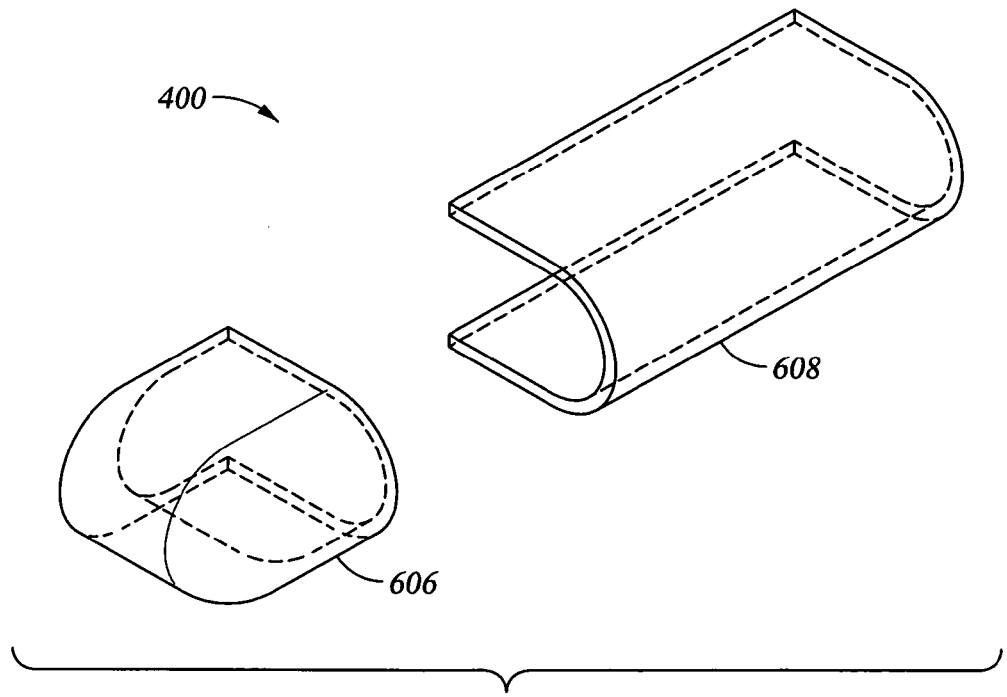
Fig. 6D

METHODS AND APPARATUS FOR PROVIDING A FLOATING SEAL HAVING AN ISOLATED SEALING SURFACE FOR CHAMBER DOORS

The present application claims priority from U.S. Provisional Patent Application Ser. No. 60/598,039, filed Aug. 2, 2004 entitled "Methods And Apparatus For Providing A Floating Seal For Chamber Doors," which is hereby incorporated by reference herein in its entirety for all purposes.

The present application also claims priority from and is a continuation-in-part of U.S. patent application Ser. No. 11/145,018, filed Jun. 2, 2005 now U.S. Pat. No. 8,206,075 and entitled "Methods And Apparatus For Sealing A Chamber" which itself claims priority to both U.S. Provisional Patent Application Ser. No. 60/587,114, filed Jul. 12, 2004 and U.S. Provisional Patent Application Ser. No. 60/576,906, filed Jun. 2, 2004, all of which are hereby incorporated by reference herein in their entirety for all purposes.

FIELD OF THE INVENTION

The present invention relates generally to flat panel display and/or electronic device manufacturing chambers and methods and apparatus for sealing doors of such chambers.

BACKGROUND OF THE INVENTION

In many electronic device fabrication processes, vacuum process chambers are widely used for conducting various chemical or physical processes. For instance, vacuum process chambers are widely used in deposition processes such as chemical vapor deposition or physical vapor deposition; in coating processes such as a spin coating process for a photoresist material or a spin-on-glass material; and various other fabrication processes. In addition, to protect against contamination from foreign particles, transfer chambers may also be operated under vacuum conditions. Conventional chambers are sealed using doors that rely upon an O-ring or similar sealing element in the door that contacts a sealing surface on the wall of the chamber around the door opening. In order to prevent leaks, the door must seal reliably each time it is closed. Thus, methods and apparatus for reliably sealing a door of a chamber are desirable.

SUMMARY OF THE INVENTION

In one aspect, the present invention provides a method including isolating a sealing surface from a chamber wall of a chamber and sealing the chamber between the sealing surface and the chamber wall.

In another aspect, the present invention provides an apparatus including a chamber wall section prone to deflection, a stationary section providing a sealing surface, and a flexible bellows attached to the chamber wall section and the stationary section.

In an additional aspect, the present invention provides a system that includes a chamber including a chamber wall having an opening, a door disposed to seal the opening, a sealing surface adjacent the opening and isolated from the chamber wall, and a seal between the sealing surface and the chamber wall.

In yet another aspect, the present invention provides a replaceable part including a flexible bellows that includes a first flange portion, a second flange portion, and a flexible portion attached to the first and second flange portions.

Other features and aspects of the present invention will become more fully apparent from the following detailed description of exemplary embodiments, the appended claims, and the accompanying drawings.

BRIEF DESCRIPTION OF THE FIGURES

FIG. 6A is a perspective view of the chamber opening of FIG. 4.

FIG. 6B is a detail view of the encircled portion of FIG. 6A.

FIG. 6C is a cross-sectional view taken along line C-C in the encircled portion of FIG. 6A.

FIG. 6D is an exploded perspective view of a portion of a flexible bellows according to some embodiments of the present invention.

DETAILED DESCRIPTION

Figure 1A:
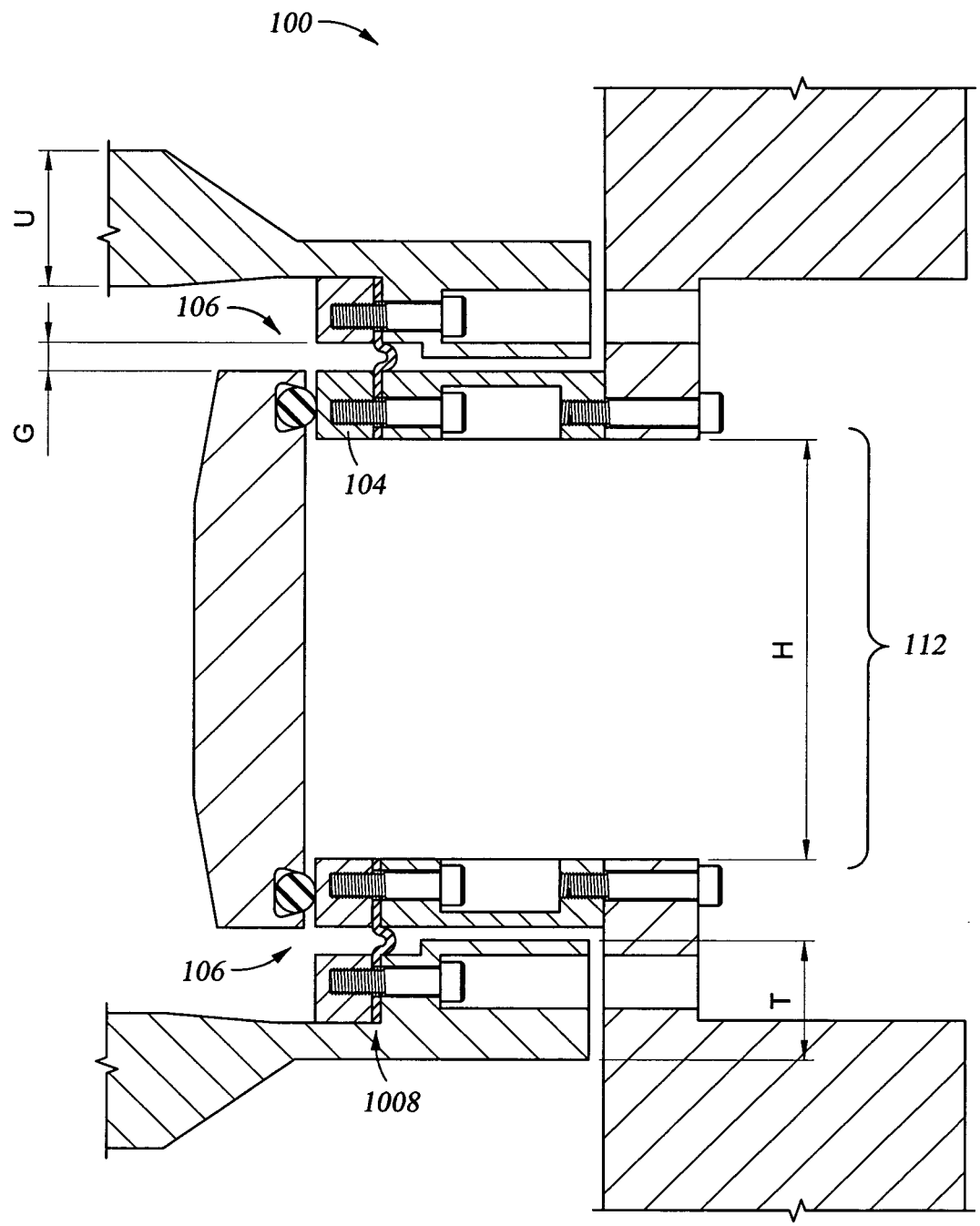
FIG. 1A is a cross-sectional view of a chamber opening with an example of a floating seal using flexible bellows according to some embodiments of the present invention.

The present invention provides improved methods and apparatus for sealing chambers (e.g., processing chambers, transfer chambers, loadlocks, etc.) and other devices that require airtight seals. By providing a stationary floating sealing surface, the present invention prevents a sealing surface from moving relative to the door sealing element. This avoids abrasion and wear of the door sealing element and prevents the generation of contaminate particles. Thus, by providing a mechanically isolated sealing surface (e.g., a sealing surface surrounding a chamber opening), the present invention ensures that the chamber door is able to consistently achieve a seal upon closure even when chamber walls experience significant deflection. In various embodiments, the sealing surface "floats" relative to the chamber wall and is thus not subject to displacement as the chamber wall deflects due to vacuum pressure changes or thermal expansion/contraction. Thus, the inventive methods and apparatus may prevent a sealing surface from sliding relative to a door sealing element, prevent the generation of particles, prevent the abrasion and wear of the sealing element, and provide means to ensure proper sealing performance.

The inventors of the present invention have noticed that due to deflection of the chamber wall that results from chamber pressure and temperature differentials between the chamber and its surrounding environment (e.g., from adjacent chambers and/or atmospheric pressure outside the chamber), O-rings or similar sealing elements alone may not consistently create a good seal. The inventors have further observed that sealing elements used as seals in conventional chamber doors are subject to abrasion from moving sealing surfaces as the chamber walls deflect under pressure and/or due to thermal expansion. This abrasion results in the generation of contaminating particles, wear of the sealing elements, and ultimately poor sealing performance. The problem increases over time as a chamber cycles through different processes and the sealing element further degrades from wear. The problem is particularly acute in chambers such as loadlocks that require frequent "pumping down" (depressurization) and venting (re-pressurization).

Further, in tool designs with multiple chambers that share a common wall, such as large "stacked" chambers (e.g. double and triple loadlocks), the different chambers may be under different pressures at the same time and the deflection of the chamber walls may be cumulative from one chamber to another. This situation may result in significant displacement of sealing surfaces relative to the door sealing element.

In some embodiments of the present invention, the sealing surface may be supported by a flexible bellows that allows the sealing surface to remain stationary against the door sealing element when the chamber wall deflects. The flexible bellows may also seal the gap between the chamber wall and the sealing surface. In some embodiments, the bellows may include a molded rubber bellows attached to both the sealing surface and a flexible seat or plate. The flexible seat may be mounted to the chamber wall where deflection is minimal or to a rigid support member within the chamber (or external to it) that is not subject to displacement when the chamber wall deflects.

In alternative or additional embodiments, the size of the gap between the chamber wall and the sealing surface may be chosen to accommodate the largest possible amount of chamber deflection. For example, in the AKT-25KA model transfer chamber manufactured by Applied Materials, Inc., the amount of deflection of the chamber at the center of the door opening may be approximately 4 mm and, in accordance with the present invention, a gap to accommodate such deflection may be approximately 8 mm. Likewise, the size and elasticity of the bellows may be chosen to accommodate the largest possible amount of chamber deflection.

Figure 1B:
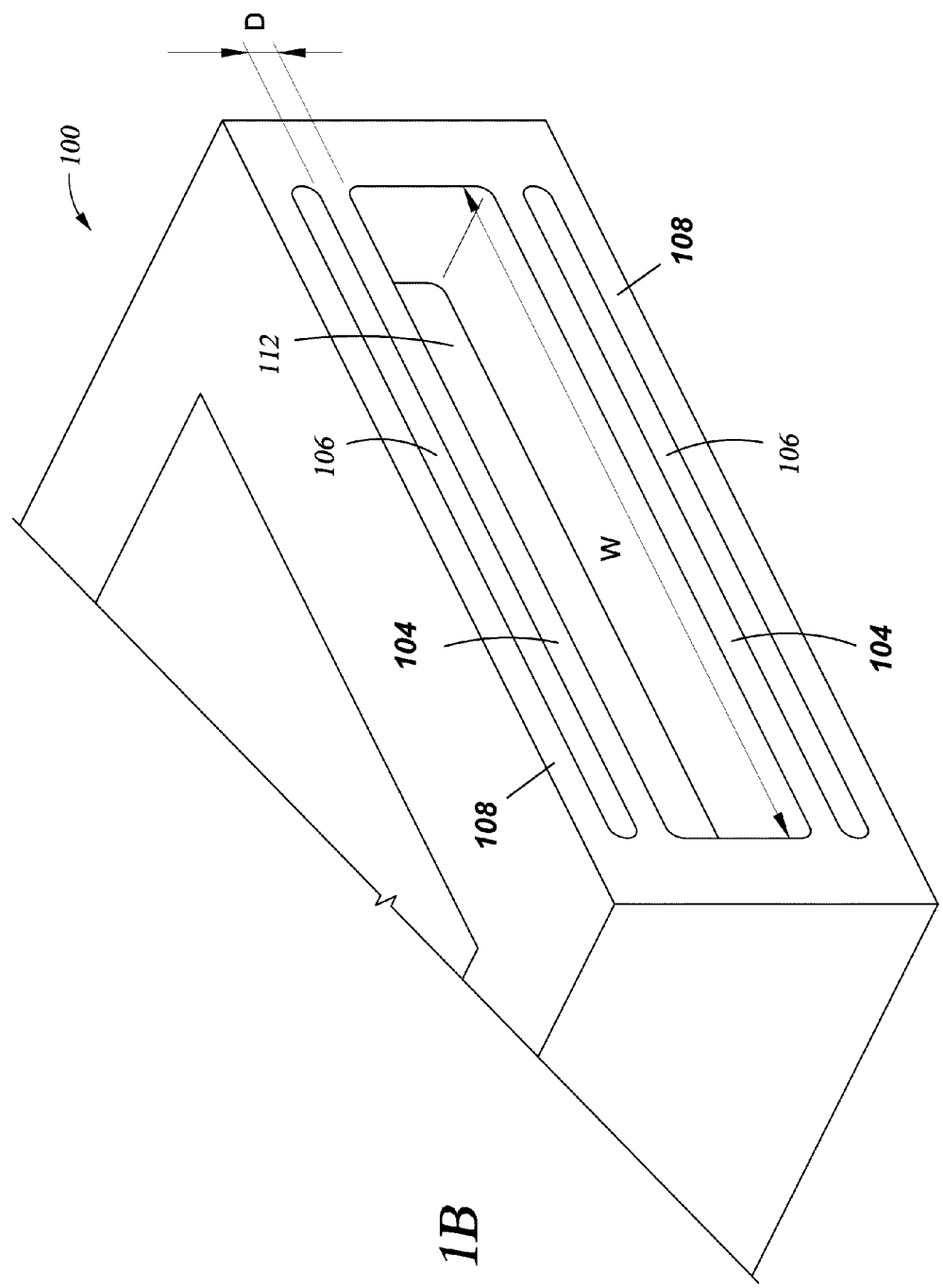
FIG. 1B is a perspective drawing of the chamber opening of FIG. 1A.

In some embodiments, only the sealing surface above and below a chamber opening (e.g., a door opening) may be isolated from the chamber wall deflection. In such floating seal embodiments, any deflection of the sealing surface at the sides of the chamber door opening may not be significant. FIG. 1A is a cross-sectional view, and FIG. 1B is a partial perspective view, each depicting an example embodiment of such a floating seal apparatus 100 according to the present invention. Note that the chamber door 102 contacts the fixed sealing surface 104 which is separated by a gap 106 from the chamber body 108. Note also that the gap 106 is sealed by the flexible bellows 110.

Referring to the particular example floating seal apparatus 100 illustrated in FIGS. 1A and 1B, in some embodiments, the individual features and components of the invention may be proportioned relative to each other as depicted. In some embodiments, the features and components may be proportioned very differently than depicted. For example, in the AKT-25KA model transfer chamber mentioned above, the height (H) of the chamber door opening 112 may be approximately 127 mm; and the width (W) of the chamber door opening 112 (and/or deflection gaps 106) may be approximately 1524 mm. In such a apparatus 100, in at least one embodiment of the invention, the size (G) of the gaps 106 between the chamber body 108 and sealing surface 104 may be approximately 8 mm; and the distance (D) between the chamber door opening 112 and the gaps 106 may be approximately 25 mm. The thickness (T) of the chamber body 108 near the door 102 may be approximately 50 mm and further into the chamber (e.g., at dimension U), approximately 113 mm.

Note that the cumulative size (e.g., two times dimension G) of the two gaps 106 may be selected so that together the two gaps 106 can jointly accommodate the maximum amount of chamber body/wall 108 deflection possible.

Figure 2:
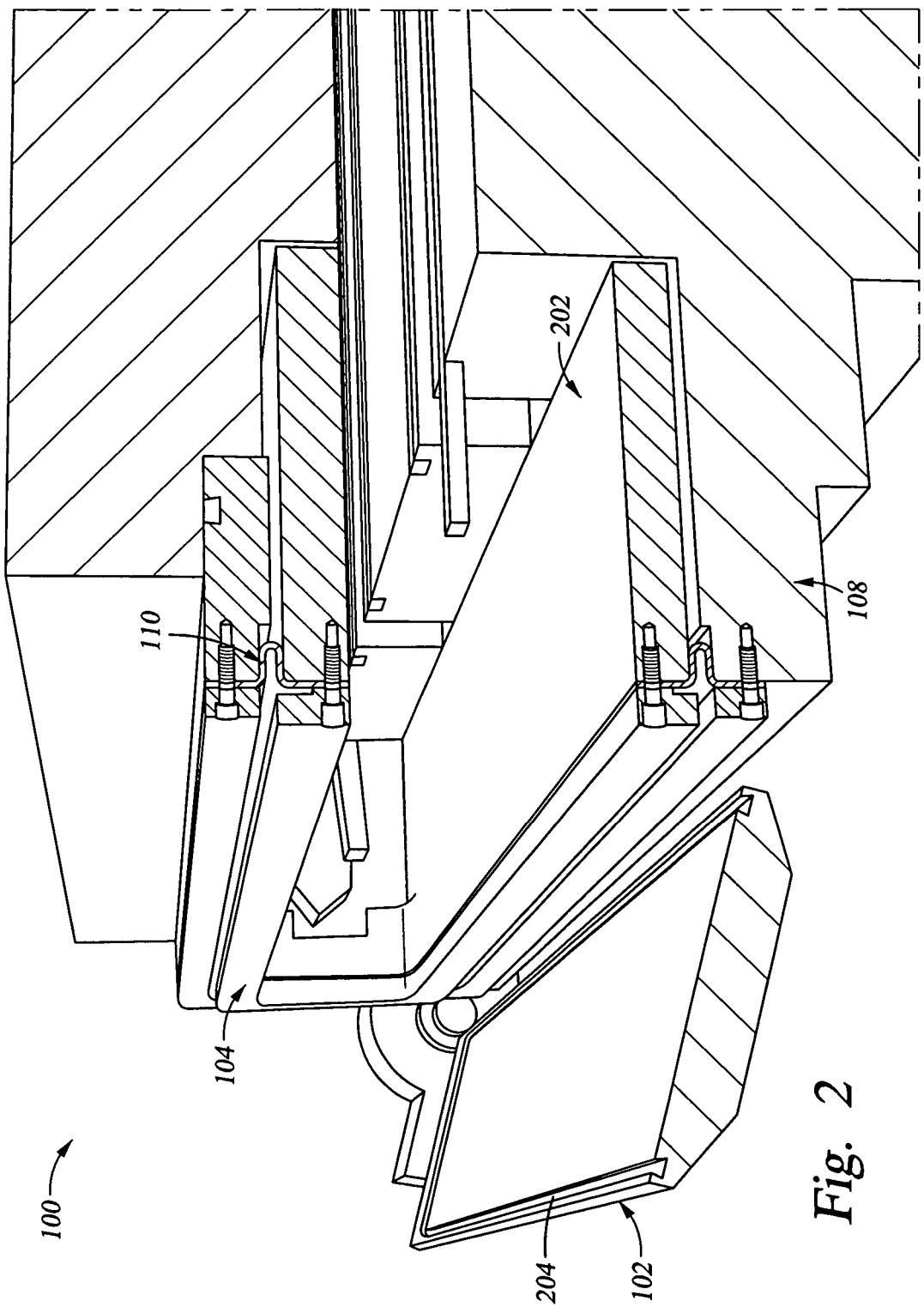
FIG. 2 is a cut-away perspective view of an example of a floating seal using a molded rubber bellows according to some embodiments of the present invention.

Turning to FIG. 2, a more detailed cut-away perspective view of the above-described embodiment of the floating seal apparatus 100 according to the present invention is provided. During pumping and venting, the sealing surface 104 attached to the flexible seat/plate 202 remains stationary relative to the door sealing element 204, even when the chamber wall 108 deflects. Thus, the present invention prevents or reduces sealing element abrasion and contaminant particle generation.

Figure 3:
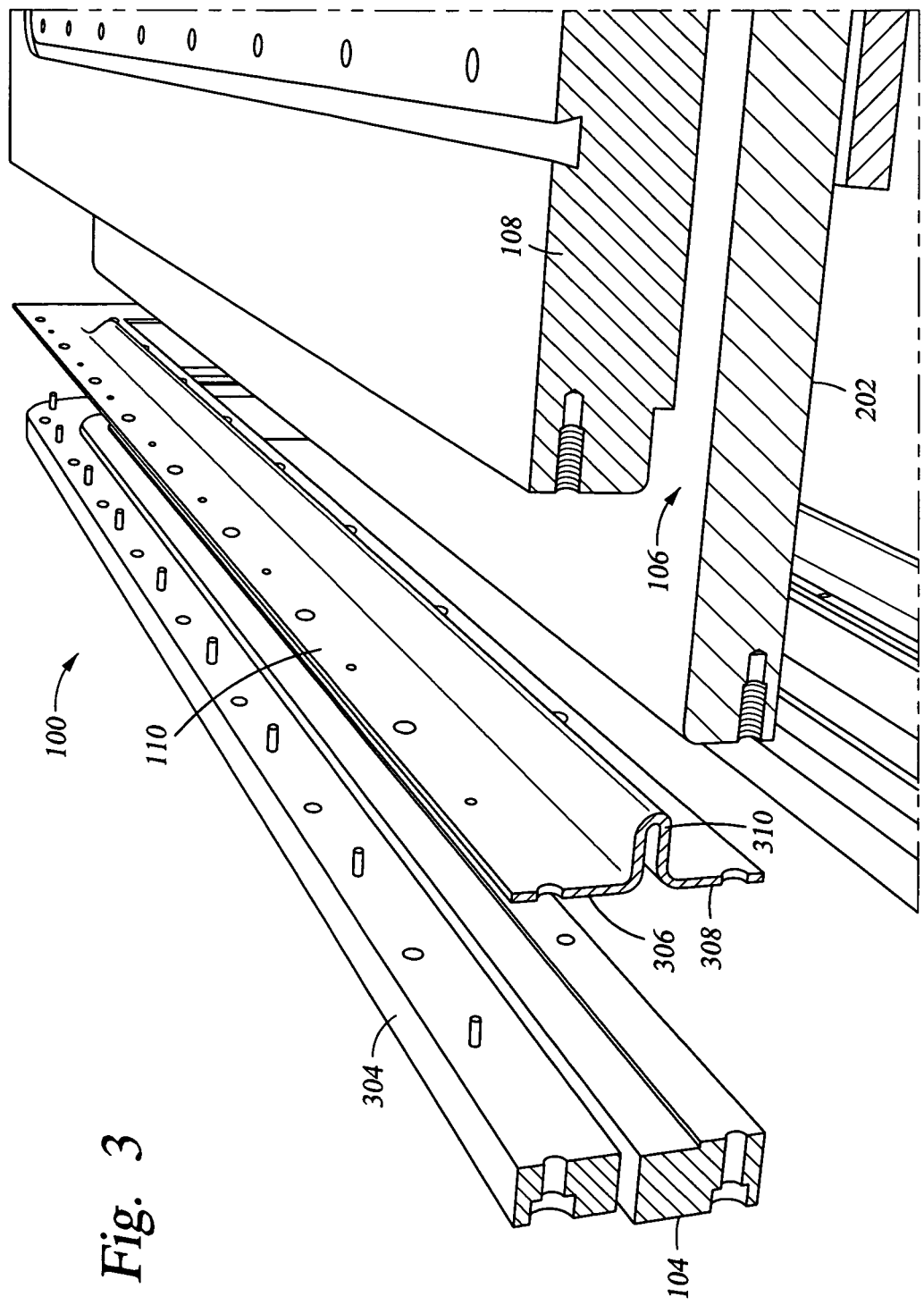
FIG. 3 is a cut-away exploded view of an example of a portion of floating seal according to some embodiments of the present invention.

Turning to FIG. 3, an exploded cut-away partial perspective view is provided that depicts more detail of an upper portion of the above described embodiment 100 and illustrates an example of a molded rubber bellows 110 that may be used to seal the gap 106 between a flexible seat/plate 202 (upon which the sealing surface 104 mounts) and chamber body 108. Note that in the example depicted, a mounting frame 304 is used to clamp (or otherwise fasten) one flange edge 306 of the bellows 110 to the chamber body 108 and the sealing surface 104 is used to clamp (or otherwise fasten) the other flange edge 308 of the bellows 110 to the flexible seat/plate 302. When employed with the AKT-25KA transfer chamber example embodiment discussed above, a flexible portion 310 of the flexible bellows 110 (e.g., the portion not including flange portions 306, 308 for clamping the bellows 110 to the chamber 108 and sealing surface 104) may be dimensioned to fit tightly within the gaps 106 between the chamber body 108 and sealing surface 104/flexible seat/plate 302 and thus may be approximately 9 mm high (including a contact bead (not shown) running the length of the bellows 110). The thickness of such bellows 110, for example, may be approximately 2.3 mm.

In some embodiments, the bellows 110 may be made from any suitable material such as a fluorocarbon (FKM) rubber compound. Alternatively, in some embodiments, other compounds such as butyl (IIR), ethylene propylene (EPDM), fluorosilicone (FVMQ), hydrin (CO/ECO), neoprene (CR), nitrile (NBR), silicone (VMQ), styrene butadyene (SBR), or the like may be used. Bellows made from rubber compounds provide a relatively low cost, low maintenance, easy to replace, and easy to manufacture means of sealing the gap between the sealing surface (and/or flexible seat/plate) and the chamber wall.

In some embodiments, the flexible bellows may be implemented using a thin, flexible convolution of sheet metal. Any suitable metal may be used such as, for example, stainless steel. A flexible bellows formed from thin folded metal may be more durable and reliable than rubber compounds and thus, may be suitable for use in inaccessible locations or difficult-to-maintain applications such as the seal between a process chamber and a transfer chamber. As with the rubber compound bellows embodiments discussed above, the flexible metal bellows absorbs any deflection of the chamber wall without displacing the sealing surface.

Figure 4:
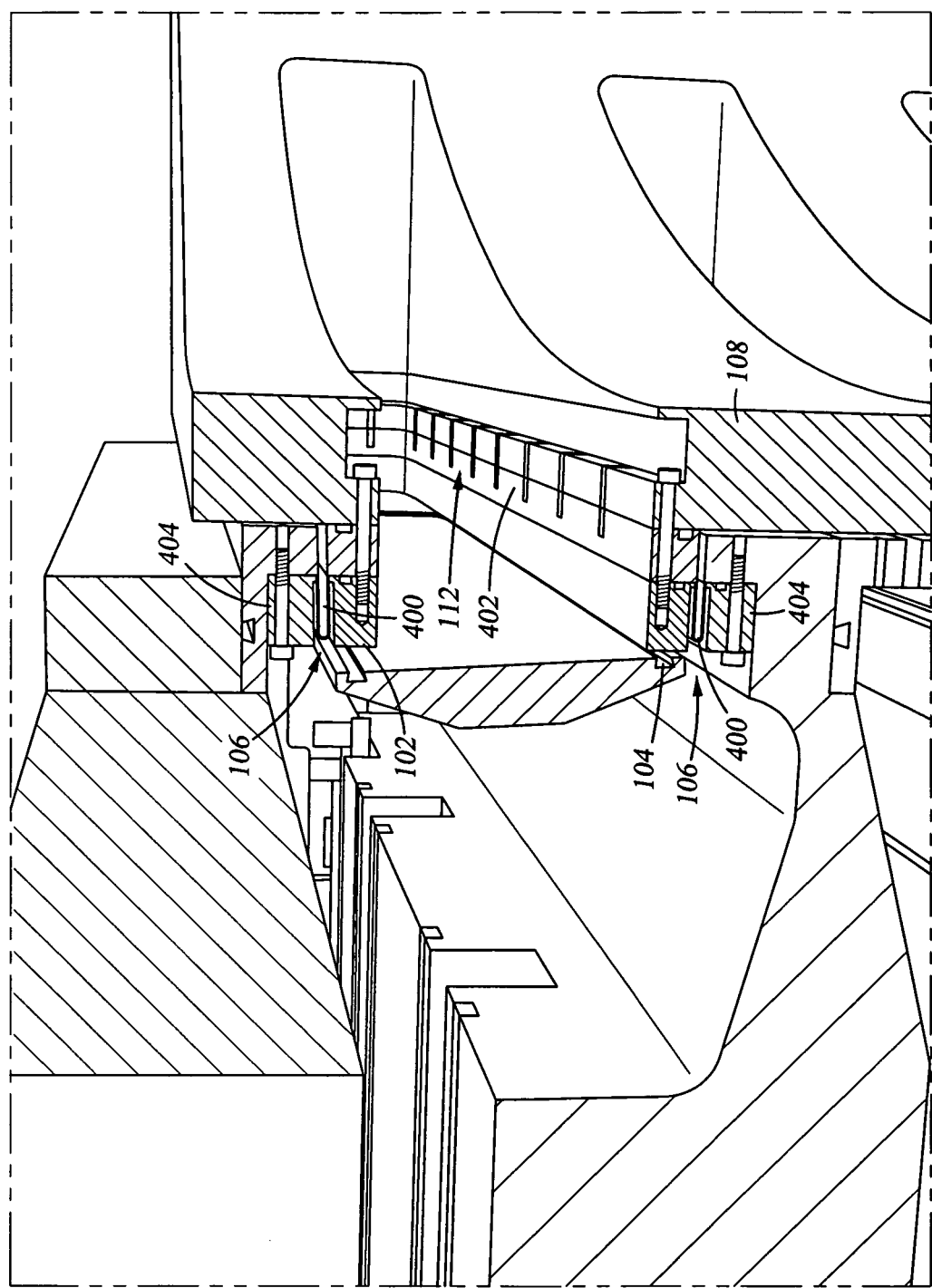
FIG. 4 is a cross-sectional perspective view of an example of a floating seal using a flexible metal bellows according to some embodiments of the present invention.

An example embodiment of the present invention using a metal bellows 400 is depicted in FIG. 4. FIG. 4 is a cut-away perspective drawing illustrating that the sealing surface 104 is mounted to a rigid structure 402 outside the chamber to maintain a stationary position while a flexible section 404 is mounted to the chamber wall 108 and will deflect as the wall 108 deflects. A metal bellows 400 is disposed between the stationary sealing surface 104 and the flexible section 404 to create a flexible seal in the slit or gap 106 between the sealing surface 104 and the flexible section 404. In some embodiments, the slit/gap size may be chosen to accommodate the largest anticipated amount of chamber wall deflection possible.

Figure 5:
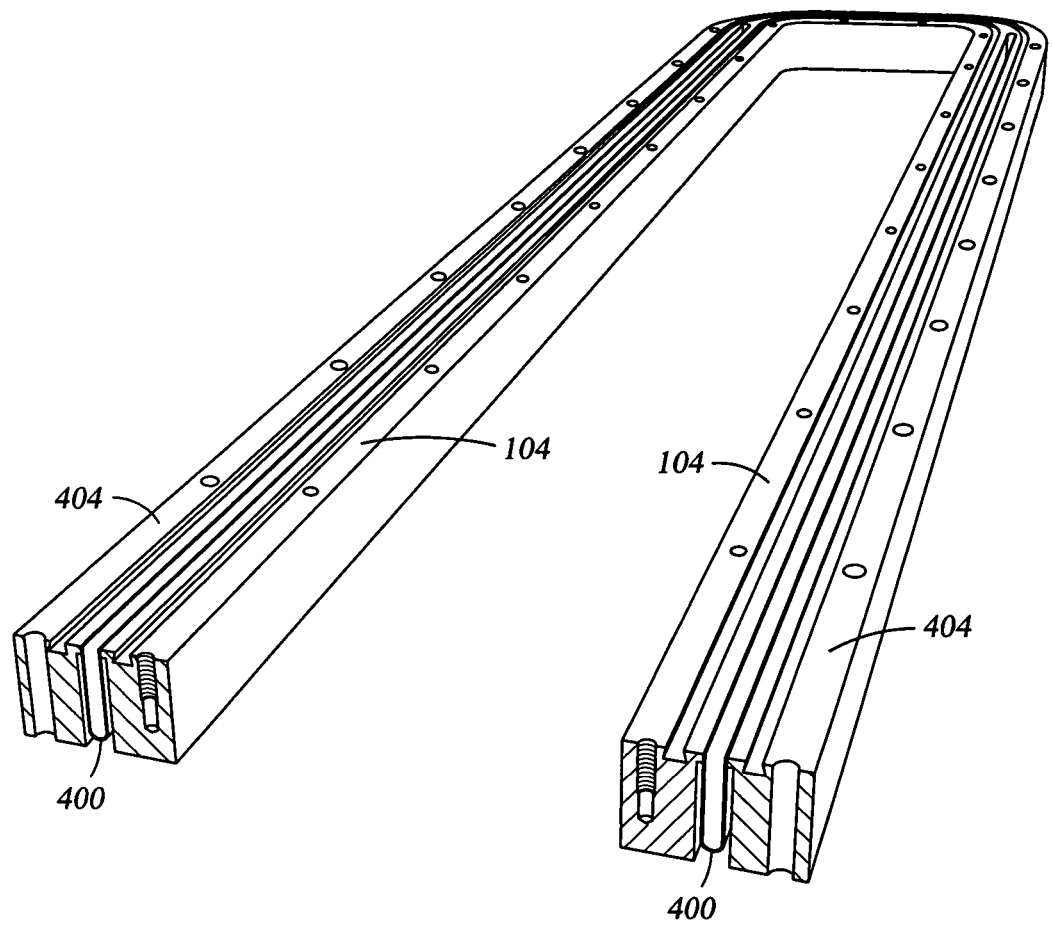
FIG. 5 is a cut-away perspective view of an example of a portion of floating seal according to some embodiments of the present invention.

Turning now to FIG. 5, a perspective cut-away view of just the flexible bellows 400, the stationary sealing surface section 104, and the flexible section 404 is provided. Note that the image in FIG. 5 is rotated ninety degrees from the depiction in FIG. 4. Also note that only a portion of the sections 104, 404 are depicted to illustrate the bellows 400. In some embodiments, a complete flexible floating seal may frame the entire chamber opening 112 (FIG. 4).

Turning to FIGS. 6A through 6D, details of the construction of an example embodiment of a flexible metal bellows 400 are depicted. FIG. 6A is a perspective view of the chamber opening 112 of FIG. 4. FIG. 6B is a detail view of the encircled portion 604 of FIG. 6A. FIG. 6C is a cross-sectional view taken along line C-C in the encircled portion 604 of FIG. 6A. FIG. 6D is an exploded perspective view of a portion of a flexible bellows 400.

Referring specifically to FIG. 6A, note that in the depicted example embodiment, the sealing surfaces 104 above and below the chamber door opening 112 are isolated from the chamber wall 108 but the sides 602 are not. As indicated above, in some embodiments the deflection on either side 602 of the chamber door opening 112 may not be significant. As shown in FIGS. 6B and 6D, corner blocks 606 or cones may be attached (e.g., welded) to both ends of a thin folded sheet of metal 608 such as stainless steel to form a single-piece flexible metal bellows 400. An example of such a single-piece flexible metal bellows 400 may be approximately 1550 mm long, 8 mm high, 12 mm deep, and made from sheet metal approximately 0.15 mm thick. The edges 610 of the bellows 400 may then be welded to the sealing surface 104 and the chamber wall 108 as shown in FIG. 6C. Note that, as depicted in FIG. 6C, in some embodiments, grooves 612 may be milled in the chamber wall 108 and the sealing surface 104 along either side of the deflection gap 104 to provide edges 614, 616 of suitable thickness for which to weld the flexible metal bellows 400. In some embodiments for example, the grooves 612 may be approximately 4 mm deep and 2 mm wide.

Also note that as with a rubber compound bellows, the size and elasticity of the flexible metal bellows 400 may be chosen to accommodate the largest possible amount of chamber deflection.

While the present invention has been described at some length and with some particularity with respect to the several described embodiments, it is not intended that it should be limited to any such particulars or embodiments or any particular embodiment, but it is to be construed with reference to the following claims so as to provide the broadest possible interpretation of such claims in view of the prior art and, therefore, to effectively encompass the intended scope of the invention.

The invention claimed is:

1. A method comprising:
   providing a chamber having a chamber wall, the chamber wall including a chamber opening for a doorway;
   providing a flexible seat around the chamber opening such that at least one gap is formed between the flexible seat and the chamber wall;
   mounting a sealing surface for a door on the flexible seat such that the gap is between the sealing surface and the chamber wall;
   sealing the at least one gap between the sealing surface and the chamber wall; wherein:
   the at least one gap includes a first horizontal gap above the chamber opening and a second horizontal gap below the chamber opening; and
   the first and second gaps are formed of sufficient size to accommodate a largest pre-determined amount of chamber wall deflection and to span a width of the chamber opening.

2. The method of claim 1 wherein the at least one gap spans along a major dimension of the chamber opening.

3. The method of claim 1 wherein sealing the at least one gap includes using a bellows to seal the at least one gap between the sealing surface and the chamber wall.

4. The method of claim 3 wherein using a bellows includes using a bellows constructed of a molded compound.

5. The method of claim 3 wherein using a bellows includes using a flexible metal bellows.

6. The method of claim 5 wherein using a flexible metal bellows includes using a metal bellows that is flexible in a direction of anticipated deflection of the chamber wall.

7. The method of claim 3 wherein using a bellows includes using a flexible metal bellows having a corner block at each end.

8. The method of claim 3 wherein using a bellows includes using a single-piece bellows having a length of approximately 1550 mm, a height of approximately 8 mm, and a depth of approximately 12 mm.

9. The method of claim 1 wherein the at least one gap is approximately 8 mm between the sealing surface and the chamber wall.

10. The method of claim 1 wherein a distance from the chamber opening to the at least one gap is approximately 25 mm.

* * * * *